REACTANCE TRANSISTOR CIRCUIT CONFIGURATION

Filed July 18, 1967 3 Sheets-Sheet 1

PRIOR ART

Reiichi Sasaki
Michio Furuhashi
INVENTORS

BY Wenderoth, Lind & Ponack
ATTORNEYS

Sept. 23, 1969 REIICHI SASAKI ET AL 3,469,214

REACTANCE TRANSISTOR CIRCUIT CONFIGURATION

Filed July 18, 1967 3 Sheets-Sheet 2

Reiichi Sasaki
Michio Furuhashi INVENTORS

BY Wenderoth, Lind and Ponack ATTORNEYS

REACTANCE TRANSISTOR CIRCUIT CONFIGURATION

Filed July 18, 1967 3 Sheets-Sheet 3

Reiichi Sasaki
Michio Furuhashi
INVENTORS

BY Wenderoth, Lind and Ponack
ATTORNEYS

United States Patent Office 3,469,214

Patented Sept. 23, 1969

3,469,214

REACTANCE TRANSISTOR CIRCUIT CONFIGURATION

Reiichi Sasaki and Michio Furuhashi, Hirakata-shi, Japan, assignors to Matsushita Electric Industrial Co., Ltd., Osaka, Japan Filed July 18, 1967, Ser. No. 654,168
Claims priority, application Japan, Aug. 26, 1966, 41/56,596; Apr. 17, 1967, 42/24,362
Int. Cl. H01p *1/24*
U.S. Cl. 333—80 4 Claims

ABSTRACT OF THE DISCLOSURE

The present invention concerns a reactance transistor circuit configuration having an improved linearity of frequency control and less distortion. It is comprised of: a reactance transistor having base, emitter and collector electrodes; input circuit means for applying a control signal between the base and the emitter electrodes of the reactance transistor; and an impedance element coupled in parallel to the base and emitter electrodes of the reactance transistor. A voltage variable capacitance means is connected across the base and collector electrodes of the reactance transistor; and a voltage control means is coupled to the collector of the reactance transistor. The voltage control means is designed to produce a variation in the voltage across the voltage variable capacitance means in accordance with the variation of the collector current of the reactance transistor.

BACKGROUND OF THE INVENTION

Field of the invention

This invention relates to reactance circuit configurations and in particular to the reactance circuit configuration used in a frequency modulation and automatic frequency and/or phase control system. This invention further relates to reactance bi-polar semiconductor circuit configurations in combination with a voltage variable capacitance device.

Description of the prior art

In the prior art, reactance tube circuits generally are used for controlling the frequency of an oscillator in a frequency modulation and automatic frequency and/or phase control system with a reactance circuit. This is attributed to the fact that conventional tube circuits have rather high sensitivity, that is, a high ratio of frequency change to input voltage variation, and a rather wide range of linear characteristics. However, the recent developments in the transistorization of electronic circuit systems has required the transistorization of said circuits. It has been known in the prior art that frequency modulation or frequency control circuits can be built up by using a reactance transistor instead of a reactance tube. The operation of this reactance transistor is based on the fact that hybrid-h parameters of transistors vary with the variation of the emitter current in accordance with the input signal level. However, since this variation ratio of hybrid-*h* parameters decreases with an increase in the emitter current the characteristic of frequency modulation or frequency control is inherently non-linear. This non-linearity causes distortion and limits the maximum frequency deviation in frequency modulations, and deteriorates the control property in automatic frequency and/or phase control systems. On the other hand, a loss conductance in parallel with the resonance circuit of an oscillator increases with an increase in the emitter current of the reactance transistor. This is apt to lower the effective Q (quality factor). The increase in the emitter current deteriorates the control sensitivity and causes an oscillator to have a narrow frequency operating range.

These drawbacks prevent a reactance transistor from being widely used as a frequency control device in a transistorized color television receiver. Occasionally it has been attempted to use a voltage variable capacitance device instead of the reactance transistor. However, circuit arrangements comprising a variable capacitance device which can achieve a sufficiently satisfactory control sensitivity have not yet been developed.

SUMMARY OF THE INVENTION

It is an object of this invention to provide an improved reactance circuit configuration capable of extending the linearity and the operating frequency range.

It is another object of this invention to reduce the distortion of the modulator by employing a voltage variable capacitance device to compensate for said non-linearity at the extremes of the frequency modulation characteristic caused by a reactance transistor.

It is another object of this invention to provide a transistorized phase control circuit to reproduce a picture with a correct hue on a picture tube of a color television receiver by employing said compensating voltage variable capacitance device.

To achieve the foregoing objects, the present invention employs a reactance transistor circuit configuration comprised of a reactance transistor having base, emitter and collector electrodes; input circuit means for applying a control signal between the base and the emitter electrodes of the reactance transistor; and an impedance element coupled in parallel to the base and emitter electrodes of the reactance transistor. A voltage variable capacitance means is connected across the base and collector electrodes of the reactance transistor; and a voltage control means is coupled to the collector of the reactance transistor. The voltage control means is designed to produce a variation in the voltage across the voltage variable capacitance means in accordance with the variation of the collector current of the reactance transistor.

DESCRIPTION OF DRAWINGS

These and other objects of the invention will be apparent from the following description of the invention in connection with the accompanying drawings, in which.

DESCRIPTION OF PREFERRED EMBODIMENT

Figure 1A:
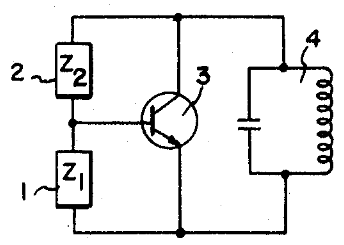
FIG. 1A is a schematic diagram of a fundamental reactance transistor circuit.

Turning now to FIG. 1A, there is shown a schematic diagram of a fundamental reactance transistor circuit. The detailed analysis of a reactance transistor circuit is explained in an article by Y. Fujimura and N. Mii entitled "Reactance Transistor," Proceedings of the I.R.E., volume 48 (1960), page 118. Such a reactance transistor circuit comprises a common emitter transistor 3, having a collector connected to an oscillator tank circuit 4. The oscillator output is divided into two parts, approximately represented by ratios $$\frac{Z_1}{Z_1+Z_2}$$

and $$\frac{Z_2}{Z_1+Z_2}$$

wherein $Z_1$ and $Z_2$ are the values of impedance 1 and impedance 2, respectively. The part represented by the ratio $$\frac{Z_1}{Z_1+Z_2}$$

is fed back to the base of the transistor 3.

When $Z_2 \gg Z_1$, the output admittance Y between the collector and the emitter of the reactance transistor is expressed approximately by the following equation:

$$Y \simeq h_{22e} + \frac{h_{21e}}{Z_1+h_{11e}} \cdot \frac{Z_1}{Z_2}$$

In this relation, the notations $h_{11e}$, $h_{21e}$, and $h_{22e}$ are the hybrid-$h$ parameters of the common emitter transistor 3. For the following conditions, $$Z_1 \ll h_{11e},\ Z_1 \ll Z_2,\ Z_1 = 1/j\omega C_1, \text{ and } Z_2 = R_2$$

the equation will be (1)

$$Y = h_{22e} + \frac{1}{j\omega\left(\frac{h_{11e}}{h_{21e}} C_1 R_2\right)} \qquad (2)$$

This Equation 2 indicates that the output admittance is an inductive reactance, and its equivalent inductance $L_e$ is $$L_e = \frac{h_{11e}}{h_{21e}} \cdot C_1 R_2 \qquad (3)$$

On the other hand, for the conditions $$Z_2 \gg Z_1,\ Z_1 = R_1, \text{ and } Z_2 = 1/j\omega C_2$$

the Equation 1 will be $$Y \simeq h_{22e} + j\omega\left(\frac{h_{21e}}{h_{11e}} \cdot C_2 R_1\right) \qquad (4)$$

This Equation 4 indicates that the output admittance is a capacitive reactance, and its equivalent capacitance $C_e$ is $$C_e = \frac{h_{21e}}{h_{11e}} C_2 R_1 \qquad (5)$$

Therefore, the circuit given in FIG. 1A can be operated to achieve the same function as a reactance tube. The capacitive reactance is preferred in a transistor circuit due to its high stability at static operation. In the conventional reactance transistor, frequency modulation or frequency control is achieved by a variation in the hybrid-$h$ parameters in accordance with the value of the input signal as indicated in Equation 5. The variation in $h_{11e}$ is approximately in an inverse proportion to the emitter current, and the variation in $h_{21e}$ is linear within a given range of the emitter current. Therefore, the equivalent capacitance $C_e$ expressed by Equation 5 increases with an increase in the emitter current, if the $C_2R_1$ is constant. The increase in the $C_e$ results in a decrease in the frequency of the oscillator.

Figure 1B:
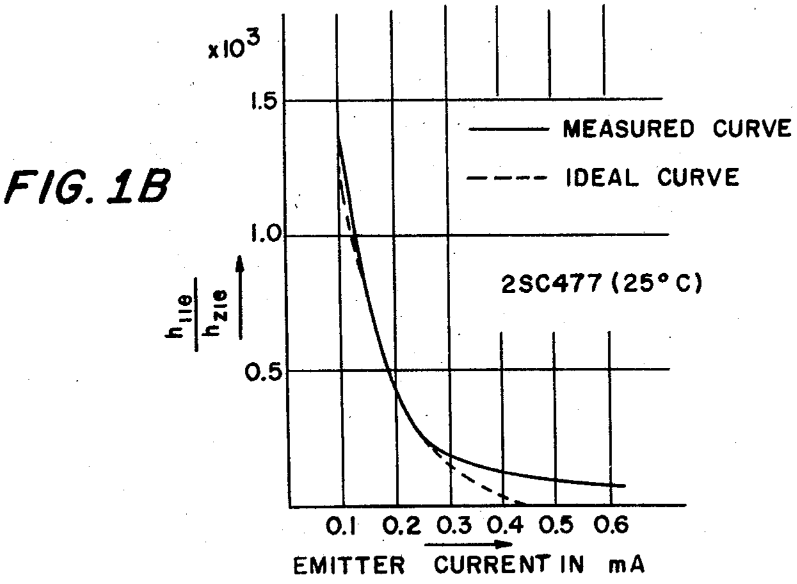
FIG. 1B is a graph illustrating the behavior of the circuit shown in FIG. 1A.

Referring to FIG. 1B illustrating a graph of the variation in $h_{11e}/h_{21e}$ with the emitter current, the solid line indicates a measured result of the operation of the silicon epitaxial planar transistor 2SC477 and the dotted line is the ideal curve required for making the frequency modulation or frequency control characteristics linear. A large departure of the measured curve from the ideal curve results in a large amount of non-linearity in the oscillator frequency vs. input voltage curve.

Figure 2A:
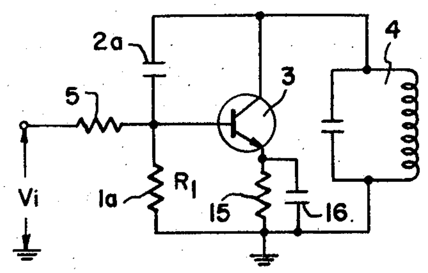
FIG. 2A is a schematic diagram of a conventional reactance transistor circuit.

Referring to FIG. 2A showing a conventional reactance transistor circuit, a fixed resistor 1$a$($R_1$) is connected between the base of the common emitter transistor 3 and ground. A fixed capacitor 2$a$($C_2$) is connected between the base and the collector of said transistor 3, and an oscillator tank circuit 4 is connected between the collector and the emitter of said transistor 3. In the frequency modulation circuit of an oscillator using this reactance transistor, the input signal applied to the base of the transistor through resistor 5($R_i$) changes the oscillator frequency. The relation between the variation in the oscillator frequency and the input signal voltage $V_i$ is shown by a dotted curve in FIG. 5B. This curve means that the oscillator frequency decreases with an increase in the input signal level, that is, an increase in the emitter current. At both ends of the oscillator frequency vs. input curve, non-linearity appears. The appearance of the non-linearity at the low frequency end of the frequency range is due to a decrease in the variation ratio of $h_{11e}/h_{21e}$ with the emitter current. This will be recognized by referring to FIG. 1B wherein the dotted line indicates the ideal relation for obtaining a linear relation between oscillator frequency and input voltage. The observed curve in FIG. 1B curves gradually downward at an emitter current higher than about 0.3 ma., whereas the ideal curve curves steeply downward when the emitter curve is about 0.3 ma. On the other hand, the departure of the dotted curve of FIG. 5B from linearity at a high oscillator frequency is an inherent non-linear property of an emitter current with respect to a base-emitter voltage.

Figures 2B, 3B:
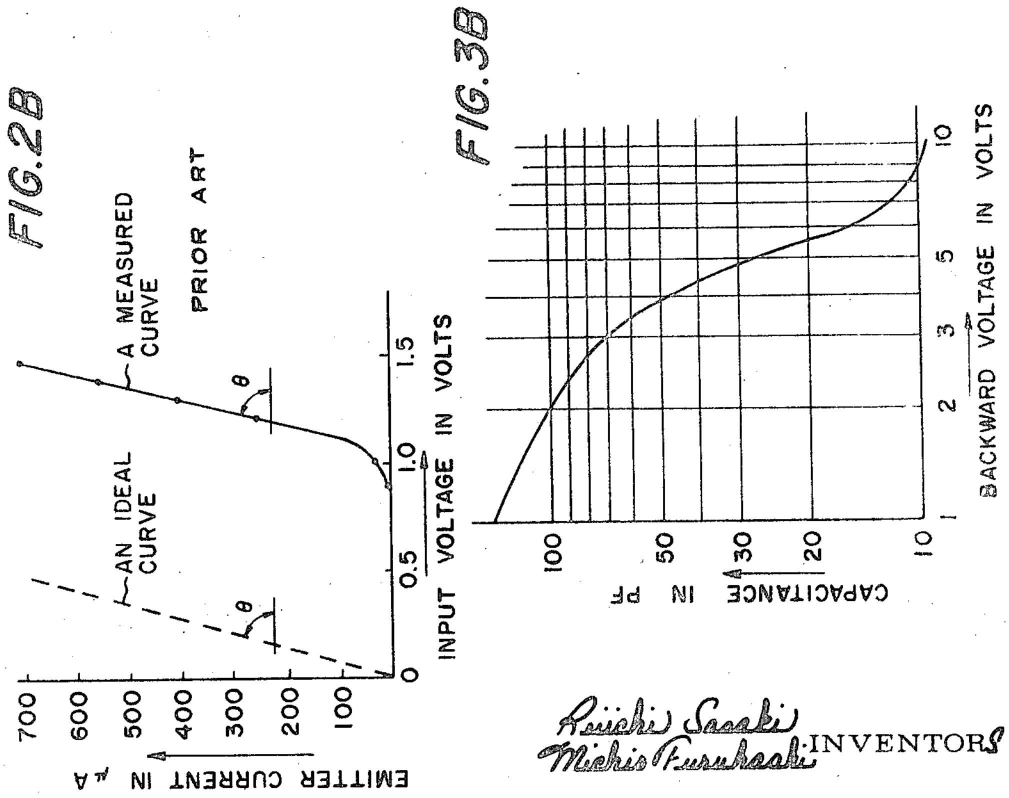
FIG. 2B is a graph illustrating the behavior of the circuit shown in FIG. 2A.
FIG. 3B is a graph illustrating the typical voltage-capacitance characteristic of a voltage variable capacitance device which is used in the circuit of FIG. 3A.

Referring again to FIG. 2A, an input voltage $V_i$ is applied to the base of the transistor 3 through a fixed resistor 5($R_i$). The relation of input voltage vs. the emitter current of said transistor 3 is indicated in FIG. 2B wherein a dotted line represents the ideal relation and the solid line represents a relation obtained by using an actual transistor meeting the specifications of transistor 3. FIG. 2B clearly indicates that the observed relation does not show a sharp increase in the emitter current as the input voltage increases from zero but rather shows a departure from linearity at a low input voltage. The departure is attributed to diode characteristics between the base and the emitter of the actual transistor 3. The departure is responsible for said departure of the dotted curve of FIG. 5B in the high frequency range. In order to overcome these inherent drawbacks of reactance in a transistor circuit having non-linear frequency modulation properties and a narrow operating range, this invention contemplates providing a useful means for obtaining linear frequency modulation properties by compensating for the non-linearity and for obtaining a large modulation sensitivity with a wide operating range.

Figure 3A:
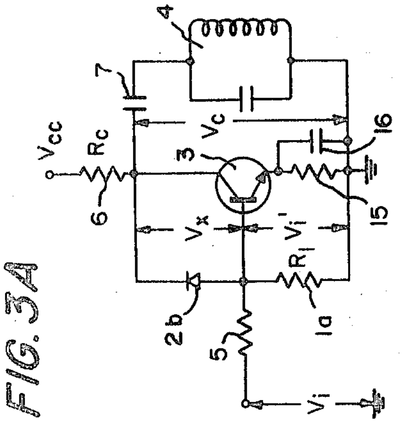
FIG. 3A is a schematic diagram of an embodiment of the reactance transistor circuit in accordance with the present invention.

Referring to FIG. 3A, a tank circuit 4 is connected, through capacitor 7 having an infinitely large impedance for direct currents and negligibly small impedance for oscillator frequency currents, between the ground and the collector of transistor 3 arranged in a common emitter circuit configuration. The fixed resistor 1$a$($R_1$) having an appropriate resistance is connected between the base of said transistor 3 and ground. The source voltage $V_{cc}$ is applied to the collector through a resistor 6 having an appropriate resistance value which will be illustrated hereinafter. The base is connected to the collector of said transistor 3 through a voltage variable capacitance diode 2$b$ in place of the fixed capacitor 2$a$ in FIG. 2A. Said diode 2$b$ is biased in the reverse direction. The backward voltage varies depending on the voltage drop obtained by the association of resistor 6 and the collector current. This additional resistor 6 has an effect only on the output admittance $h_{22}$. The resultant admittance $h'_{22}$ can be expressed by the following equation:

$$h'_{22e}=h_{22e}+\frac{1}{R_c} \quad (6)$$

However, when the value of resistor 6($R_c$) is made large so that the second term of the equation is negligibly small in comparison with the first term, this circuit can be operated as a good reactance transistor.

In FIG. 3A, when the collector current $I_c$ flows through the resistor 6, the collector-ground voltage $V_c$ of the transistor is according to the following equation:

$$V_c=V_{cc}-I_cR_c\simeq V_{cc}-I_eR_c \quad (7)$$

wherein $I_e$ is the emitter current of transistor 3. The backward voltage $V_x$ across the voltage variable capacitance diode 2*b* can be expressed by:

$$V_x=V_c-V'_i$$
$$=V_{cc}-I_cR_c-V'_i\simeq V_{cc}-I_eR_c-V'_i \quad (8)$$

wherein $V'_i$ is the base to ground voltage of transistor 3.

The voltage variable capacitance diode utilized in this circuit of the present invention is characterized by the fact that the junction capacitance decreases as the backward voltage increases as shown in FIG. 3B, wherein the capacitance in picofarads is plotted against the backward voltage in volts. It will be obvious from Equation 8 that an increase in the emitter current $I_e$ makes the backward voltage $V_x$ decrease and consequently causes the junction capacitance to increase.

It has been discovered, according to the invention, that the departure from linearity of the oscillator frequency vs input voltage $V_i$ in a low frequency range, can be suppressed by employing a voltage variable capacitance means in place of the fixed capacitance means contained in the conventional reactance transistor circuit.

It is possible to employ any voltage variable capacitance means having an abrupt change in the capacitance at a voltage corresponding to the voltage at which the oscillator frequency vs. input voltage curve departs from linearity. A preferable voltage variable capacitance means is a hyper abrupt junction silicon or germanium diode in which the capacitance increases abruptly below a backward voltage $V_B$. As a practical matter, a variable capacitance diode which is presently available to those in the art has a backward voltage $V_B$ differing from the voltage at which the oscillator frequency vs input voltage relation departs from linearity.

It has been discovered according to the invention that said backward voltage $V_B$ can be satisfactorily supplied by a resistive element 6 connected between a D-C source and the collector of said transistor 3 of FIG. 3A. The resistance of said resistor 6 can be determined by Equation 8, wherein $V_x=V_B$.

A transistor provided with an input voltage $V_i$ which is less than the diffusion voltage, generates practically no emitter current. For example, a transistor having a characteristic curve shown by the solid line of FIG. 2B produces an emitter current nearly equal to zero when the input voltage $V_i$ is less than 0.8 volt. An emitter current nearly equal to zero changes Equation 8 to the following Equation 9:

$$V_x=V_{cc}-V'_i \quad (9)$$

Therefore, a variation in the $V'_i$ results in a variation in the backward voltage applied to the variable capacitance diode, which consequently makes the capacitance of said variable capacitance diode vary with the $V'_i$. The resultant decrease in the equivalent capacitance of the reactance transistor is effective to prevent the oscillator frequency vs. input voltage from deviating from linearity in the high frequency range.

Figure 4A:
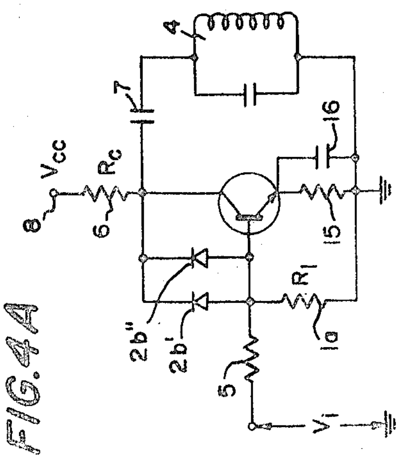
FIG. 4A is a schematic diagram of another embodiment of the reactance transistor circuit in accordance with the present invention.
Figures 4B, 5A, 5B:
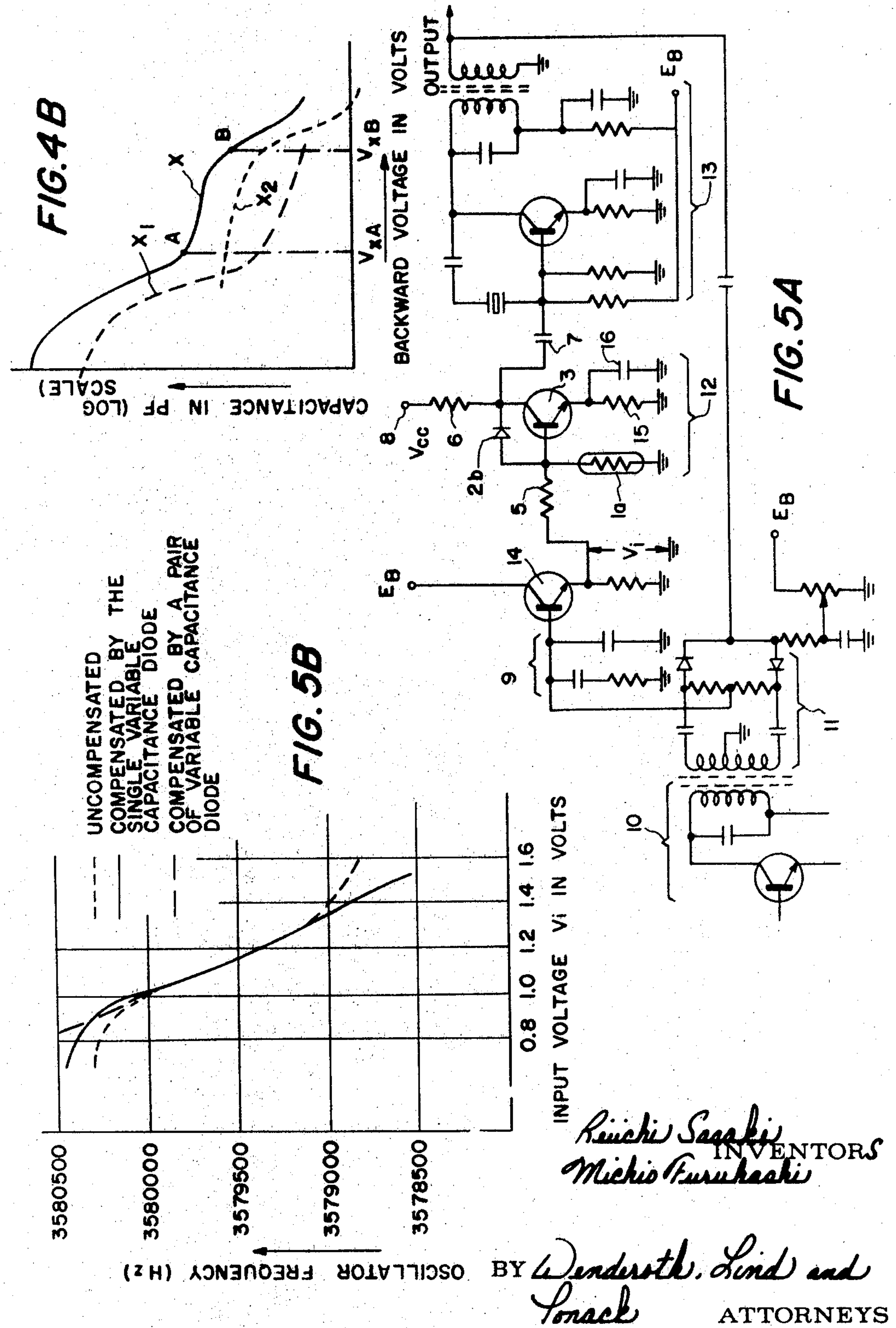
FIG. 4B is a graph illustrating the voltage-capacitance characteristics of a parallel connection of two voltage variable capacitance devices which are used in the circuit of FIG. 4A.
FIG. 5A is a schematic diagram of the transistorized subcarrier synchronizing circuit in a color television receiver, showing one practical use of an embodiment according to the principles of the present invention.
FIG. 5B is a graph illustrating an improved characteristic of the circuit of FIG. 5A.

It has been discovered according to the invention that the oscillator frequency vs. input voltage relation of FIG. 5B can be linearly extended on both ends by employing a pair of variable capacitance diodes.

Referring to FIG. 4A, wherein similar reference characters designate components similar to those of FIG. 3A, the source voltage 8($V_{cc}$) is applied to the collector of transistor 3 having a resistance 6 which will satisfy Equation 8 and the two variable capacitance diodes 2*b'* and 2*b''* having different characteristics as shown in FIG. 4B are connected in parallel between the collector and the base of transistor 3. The other parts of the circuit are the same as those of FIG. 3A.

In FIG. 4B the curve $X_1$ shows the capacitance vs. voltage characteristic of the diode 2*b'* and the curve $X_2$ shows like characteristics of diode 2*b''*. The curve X shows the resultant characteristic of the two diodes 2*b'* and 2*b''* connected together in parallel with each other. This resultant characteristic curve has a small slope in the rigion from point A to B. In the region AB there is not much variation in the capacitance for a considerable difference between the backward voltage $V_{xA}$ and the backward voltage $V_{xB}$, and this region corresponds to the linear region of the reactance transistor characteristics of FIG. 5B. The upper and lower regions of said region AB are useful for stretching the non-linear regions of the reactance transistor characteristics illustrated by dotted lines in FIG. 5B.

As mentioned with reference to FIG. 5B, the departure from linearity of the oscillator frequency vs. input voltage relation in a low frequency range is attributed to a departure from the desired curve of the $h_{11e}/h_{21e}$ vs. emitter current relation. The voltage at which the last mentioned departure occurs corresponds to an input voltage which causes a departure of the oscillator frequency vs. input voltage relation from linearity. Said backward voltage $V_{xA}$ can be supplied by employing a resistor 6 having a resistance $R_c$ which is determined by the following Equation 11 which is similar to Equation 8:

$$V_{xA}=V_{cc}-I_eR_c-V'_i \quad (10)$$

$$R_c=\frac{V_{cc}-V'_i-V_{xA}}{I_e} \quad (11)$$

The linearity of the oscillator frequency vs. input voltage relation in a high frequency range can be improved by employing a pair of variable capacitance diodes which have a resultant capacitance vs. backward voltage relation showing an abrupt decrease in the vicinity of $V_{xB}$. The frequency control characteristics obtained by employing a pair of variable capacitance diodes is shown in a dashed line in FIG. 5B.

Referring to FIG. 5A, wherein similar reference characters are used to indicate components similar to those of FIG. 3A: reference character 12 designates, as a whole, a reactance transistor circuit embodied by employing the single variable capacitance diode and connected to a 3.58 mHz. Pierce type crystal oscillator 13; A phase detector 11 is provided which detects a phase difference between an output signal of a burst amplifier 10 and an output signal of the oscillator 13 and which actuates the reactance transistor circuit 12 to automatically control the phase of the oscillator 13. The reactance transistor circuit 12 comprises a thermistor 1*a* inserted between the ground and the base of transistor 3 for improving stability with temperature.

The reactance transistor circuit 12 of FIG. 5A can be embodied by employing, for example, the following specified components:

Transistor 3=silicon epitaxial planar transistor 2SC477
Diode 2*b*=hyper abrupt junction Si diode having a capacitance of 12 picofarads at an operating frequency 3.579545 mHz.
Resistor 5=1 kΩ
Resistor 6=10 kΩ
Resistor 15=330Ω
Capacitor 16=0.01 μf.

Thermistor $1a=1.5$ kΩ at 25° C.
Supply voltage $8=12$ volts.

The frequency control characteristic obtained by employing these specified components is shown by a solid line in FIG. 5B.

It is obvious from FIG. 5B that the linear operating range of the 3.58 mHz. crystal oscillator is extended from 3579100 Hz.–3580100 Hz. to 3578600 Hz.–3580250 Hz.

The significance of the present invention can readily be appreciated from consideration of the characteristics of FIG. 5B. In the foregoing, the principles of the invention have been illustrated with an npn transistor as the reactance circuit element. It is to be understood that these principles are applicable to other types of transistors, such as a pnp transistor. Additionally, while the principles of the invention have been illustrated with the common emitter circuit, other types of circuits which might occur to workers in the art are within the purview of this invention.

What is claimed is:

1. A reactance transistor circuit configuration comprising a reactance transistor having base, emitter and collector electrodes; a voltage variable capacitance means directly connected between the base and collector electrodes of said reactance transistor; a first impedance element coupled between the base and emitter electrodes of said reactance transistor; a voltage control means coupled to the collector of said reactance transistor; said voltage control means producing a variation in the voltage across said voltage variable capacitance means according to the variation of the collector current of said reactance transistor; oscillator circuit means coupled between the emitter and the junction between said voltage control means and the collector through a coupling capacitor; a control signal source which controls the collector current of said reactance transistor; and a second impedance element coupling the junction among the base of said reactance transistor, said voltage variable capacitance means and said first impedance element to said control signal source.

2. A reactance transistor circuit configuration as claimed in claim 1 in which said voltage control means comprises a resistive element connected between a D-C source and the collector electrode of said reactance transistor.

3. A reactance transistor circuit configuration as claimed in claim 1 in which said voltage variable capacitance means comprises a hyper abrupt junction Si diode connected in the reverse direction.

4. A reactance transistor circuit configuration as claimed in claim 1 in which said voltage variable capacitance means comprises a plurality of hyper abrupt junction Si diodes provided with different capacitance versus voltage characteristics and connected in parallel and reverse biased, and has a nonsensitive region in the capacitance versus voltage curve.

References Cited

UNITED STATES PATENTS

| | | | |
|---|---|---|---|
| 3,209,278 | 9/1965 | Binkis. | |
| 3,370,123 | 2/1968 | Gassmann | 331—180 X |
| 3,377,568 | 4/1968 | Kruse et al. | 334—15 X |

HERMAN K. SAALBACH, Primary Examiner
P. L. GENSLER, Assistant Examiner

U.S. Cl. X.R.

307—233, 320; 328—155; 331—36; 332—28, 30